United States Patent [19]
Flohrs et al.

[11] Patent Number: 5,479,046
[45] Date of Patent: Dec. 26, 1995

[54] MONOLITHICALLY INTEGRATED SEMICONDUCTOR ARRANGEMENT WITH A COVER ELECTRODE

[75] Inventors: Peter Flohrs, Reutlingen; Christian Pluntke, Hechingen, both of Germany

[73] Assignee: Robert Bosch GmbH, Stuttgart, Germany

[21] Appl. No.: 263,951

[22] Filed: Jun. 22, 1994

Related U.S. Application Data

[63] Continuation of Ser. No. 962,592, filed as PCT/DE91/00445, May 27, 1991, abandoned.

[30] Foreign Application Priority Data

Jun. 28, 1990 [DE] Germany ............... 40 20 519.3

[51] Int. Cl.⁶ .................................................. H01L 29/772
[52] U.S. Cl. ........................ 257/577; 257/491; 257/603
[58] Field of Search ........................ 257/577, 139, 257/603, 487, 488, 491, 603, 567, 607, 608, 591

[56] References Cited

U.S. PATENT DOCUMENTS

| | | | |
|---|---|---|---|
| 4,074,293 | 2/1978 | Kravitz | 257/592 |
| 4,618,875 | 10/1986 | Flohrs | 257/570 |
| 4,799,100 | 1/1989 | Blanchard et al. | 257/651 |
| 4,801,555 | 1/1989 | Holly et al. | 257/591 |
| 4,916,494 | 4/1990 | Flohrs et al. | 257/603 |

FOREIGN PATENT DOCUMENTS

| | | |
|---|---|---|
| WO83-01709 | 5/1983 | WIPO . |
| WO83-02528 | 7/1983 | WIPO . |

OTHER PUBLICATIONS

Y. Sugawara et al./Hitachi Research Lab., "Practical Size Limits of High Voltage IC's," Int. Electron Devices Meeting, Dec. 5–7, 1983, Washington, D.C., IEEE, p. 412 & Fig. 1.

Primary Examiner—Robert P. Limanek
Assistant Examiner—David B. Hardy
Attorney, Agent, or Firm—Frishauf, Holtz, Goodman, Langer & Chick

[57] ABSTRACT

The invention relates to a monolithically integrated semiconductor arrangement, where from the first main surface a first zone (p) and a second zone (n⁺) are diffused into a substrate (2), which is weakly doped (substrate region n⁻) under a first main surface (3) and is more strongly doped (substrate region n⁺) under a second main surface (4). An insulating passivation layer is attached to the first main surface (3), on top of which a metallic cover electrode (D) is located, which covers adjacent substrate regions (n⁻) and the edge areas of the first zone (p) and the second zone (n⁺). In accordance with the invention, at least one additional zone (v) of the same type of conductivity as the associated zone (n⁺), but with weaker doping, is diffused in for increasing the break-through voltage, and is connected to the zone (n⁺), does not contact the other zone (p) and prevents the zone (n⁺) from directly bordering the substrate (n⁻) underneath the cover electrode (D).

7 Claims, 6 Drawing Sheets

MONOLITHICALLY INTEGRATED SEMICONDUCTOR ARRANGEMENT WITH A COVER ELECTRODE

This application is a continuation of application Ser. No. 07/962,592, filed as PCT/DE91/00445, May 27, 1991, now abandoned.

FIELD OF THE INVENTION

The invention relates to a monolithically integrated semiconductor.

BACKGROUND

In a known monolithically integrated semiconductor, Darlington transistor circuit, disclosed in DE-OS 32 37 536, FLOHRS/BOSCH and corresponding WO 83-02528, publ. Jul. 21, 1983, a substrate under a first main surface is weakly doped (substrate region $n^-$) and under another main surface, at least of the finished arrangement, is strongly doped with the same type of conductivity (substrate region $n^+$). A first zone (p), which forms a pn-junction with the substrate, and a second zone ($n^+$) of the same conductivity type as the substrate but which does not touch the first zone (p), are diffused in from the main surface.

The first main surface of the substrate is covered by an insulating passivation layer, with the exception of contact windows. A metallic cover electrode is located above this layer, which covers the substrate areas (substrate region $n^-$) bordering the first main surface, the edge areas of the first zone (p) and the edge areas of the second zone ($n^+$).

By means of the metallic cover electrode located above the space-charge limited current region, protection of a planar transistor arrangement against environmental influences, possibly connected with an effect on the break-through voltage, is achieved here. For this purpose, the cover electrode is connected to a potential between base and collector determined by a voltage divider. The break-through voltage is essentially determined by this potential and the thickness of the oxide under the cover electrode.

Employment of a voltage divider is a relatively expensive step, its integration into the semiconductor arrangement requiring silicon surface. In addition, it is desirable to achieve a higher break-through voltage with the same oxide thickness.

SUMMARY OF THE INVENTION

By diffusing in one or two additional zones (zone $\pi$ or zone $\nu$) with a doping which is weaker than that of the zones (first zone p or second zone $n^+$) extending under the cover electrode, it is possible to achieve a break-through voltage which is higher compared with the known semiconductor arrangement, while the oxide thickness remains the same. In this way, it becomes possible in certain cases to do without a voltage divider for connection of the cover electrode and to achieve the desired blocking ability by a connection of the cover electrode with the base/anode or the collector/cathode.

BRIEF FIGURE DESCRIPTION

The features of the invention will be apparent from the accompanying drawings, of which:

FIG. 1 illustrates a prior art planar semiconductor device with a voltage divider;

FIG. 2 shows a monolithically integrated semiconductor arrangement in accordance with the invention with an additional zone (zone $\nu$), which is contiguous to an $n^+$-zone, FIG. 3 shows a monolithically integrated semiconductor arrangement in accordance with the invention with an additional zone (zone $\pi$), which is contiguous to a p-zone, FIG. 4 shows a semiconductor arrangement containing both additional zones (zone $\nu$ and zone $\pi$) of FIGS. 2 and 3, FIG. 5 shows a wired semiconductor arrangement in accordance with FIG. 2, FIG. 6 shows a wired semiconductor arrangement in accordance with FIG. 3, FIG. 7 shows a diagram showing, in comparison with the prior art, the rise of the break-through voltage when using the additional zone in accordance with FIG. 2 (zone $\nu$), FIG. 8 is a diagram showing, in comparison with the prior art, the rise of the break-through voltage when using the additional zone in accordance with FIG. 3 (zone $\pi$); and FIG. 9 is a diagram similar to FIG. 2, with conductivity types reversed.

DETAILED DESCRIPTION

It should be noted in general, that the invention is to be used with transistors in accordance with planar technology. Since the emitter is of no importance there, FIGS. 1 to 6 are limited to showing the base collector diode of an npn transistor. In this case the base is designated by A (anode) and the collector by K (cathode).

The invention is also analogously suitable for pnp transistors, where the p- and n-doping should respectively be exchanged.

DETAILED DESCRIPTION

Figure 1:
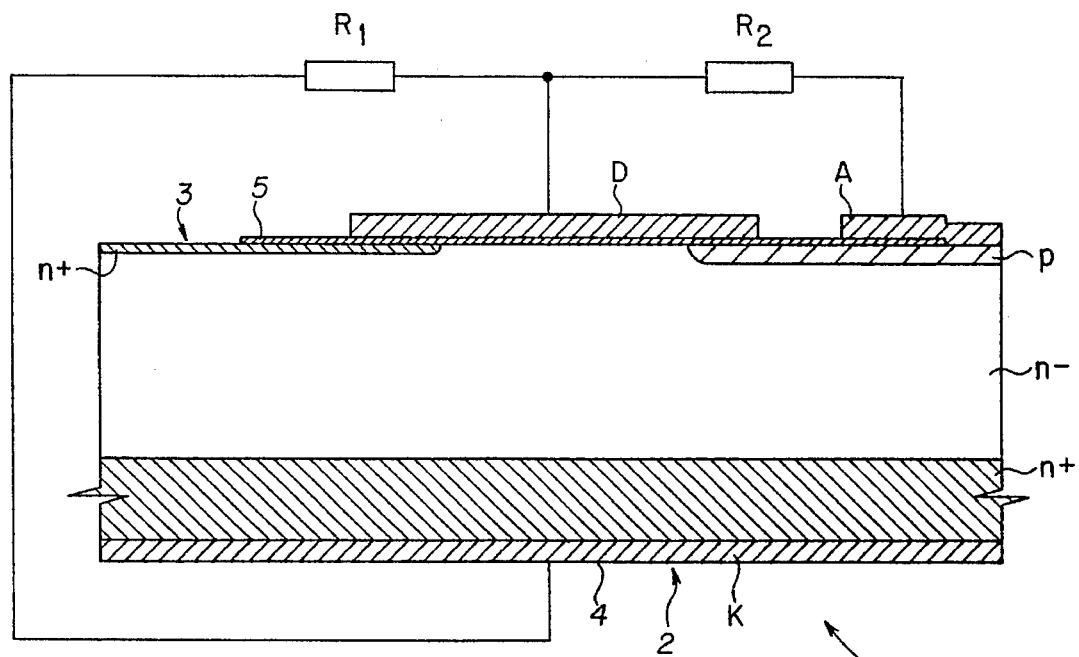

A monolithically integrated semiconductor arrangement 1 is illustrated in FIG. 1, for which the initial material for producing it is a silicon substrate 2, which is weakly doped (substrate region $n^-$) on the front (first main surface 3) and strongly doped (substrate region $n^+$) on the back (second main surface 4).

By means of photo techniques, doping and diffusion, a first zone (p), which together with the substrate 2 forms a pn-juncture, and a second zone ($n^+$) of the same conductivity type as the substrate are produced on the front 3 in a known manner. The first zone (p) and the second zone ($n^+$) do not touch. The second zone ($n^+$) can be diffused in simultaneously with the emitter.

With the exception of contact windows, the front 3 is covered with an insulating passivation layer 5, on top of which a metallic cover electrode D is disposed. The cover electrode D covers the substrate area (substrate region $n^-$) bordering the front 3, the edge areas of the first zone (p) and the edge areas of the second zone ($n^+$).

The connection for the anode A is located at the front 3 and is connected with the first zone (p). The connection for the cathode K (collector) is located on the back 4 and is connected with the substrate region ($n^+$). The second zone ($n^+$) limits the space charge to regions under the cover electrode, if reverse voltage is applied between the anode A and the cathode K.

In accordance with the prior art according to FIG. 1, the cover electrode D can be connected to a voltage divider, formed by resistors $R_1$ and $R_2$, between the anode A and the cathode K. The break-through voltages attainable between the anode A and the cathode K in case of $R_1$ or $R_2=0$ are $U_1$ or $U_2$. In this case $U_1$ is the enrichment break-through voltage and $U_2$ the depletion break-through voltage of the MOS structure formed by the cover electrode D, the oxide 5 located under it and the silicon 2. The maximally attainable break-through voltage is $U_1+U_2$, if $R_1: R_2 = U_2: U_1$. It is also known from the prior art how the voltage divider $R_1/R_2$ can be monolithically integrated in such a way, that on the front 3, instead of with the cathode K, the resistor $R_1$ is connected with the second zone ($n^+$) which is practically connected with the same potential. It is furthermore known how the reverse voltage between the anode A and the cathode K can be made adjustable, for example by means of Zener diodes in series with the resistors, which are short-circuited when required.

Figure 2:
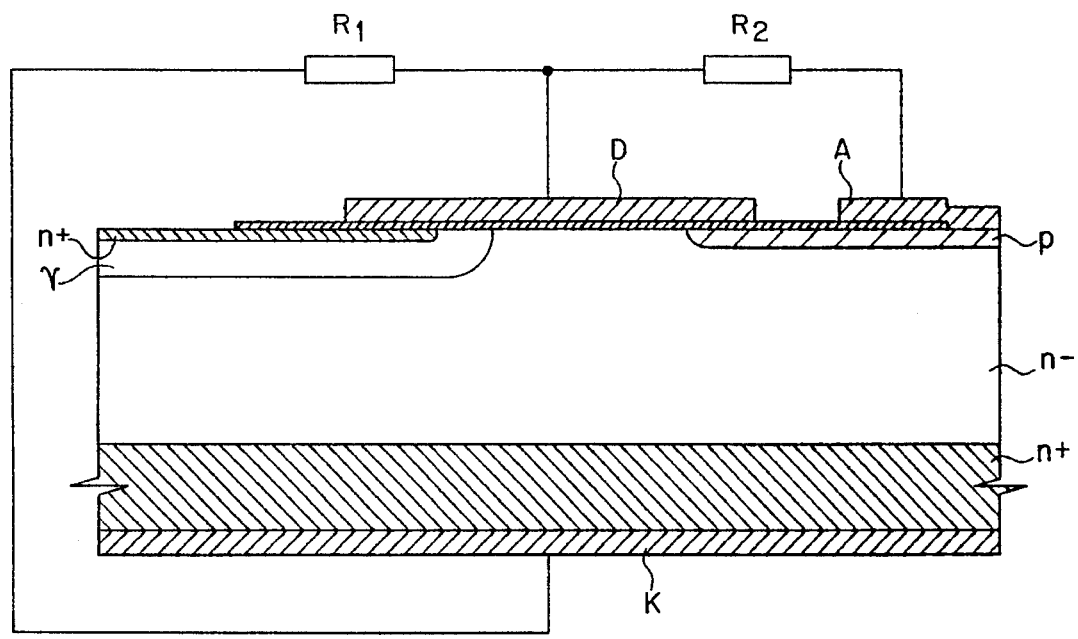

In the semiconductor arrangement of the invention in accordance with FIG. 2, the cover electrode D additionally covers an additional zone (zone ν) bordering the second zone ($n^+$), the surface concentration of which is less than that of the second zone ($n^+$).

Figure 3:
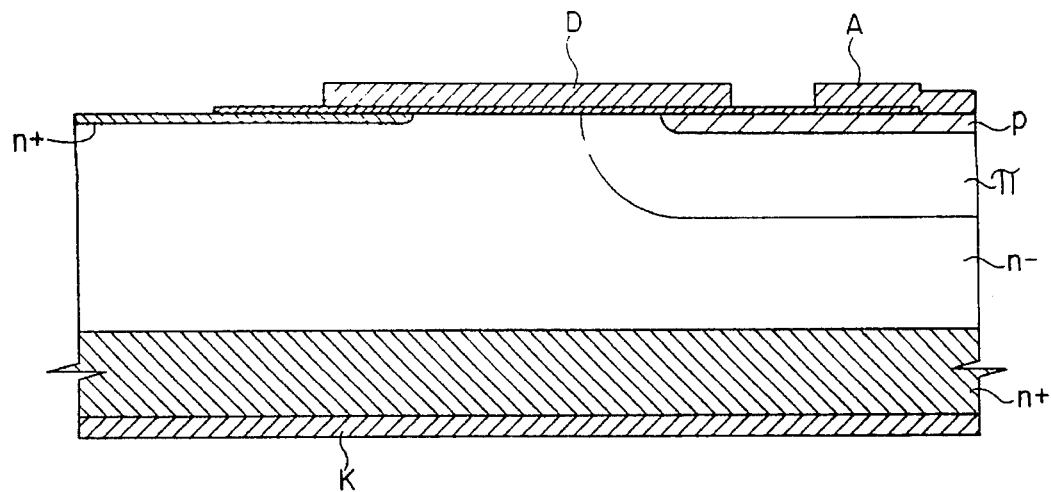

In the semiconductor arrangement of the invention in accordance with FIG. 3, the cover electrode D additionally covers an additional zone (zone π) bordering the first zone (p), the surface concentration of which is less than that of the first zone (p).

Figure 4:
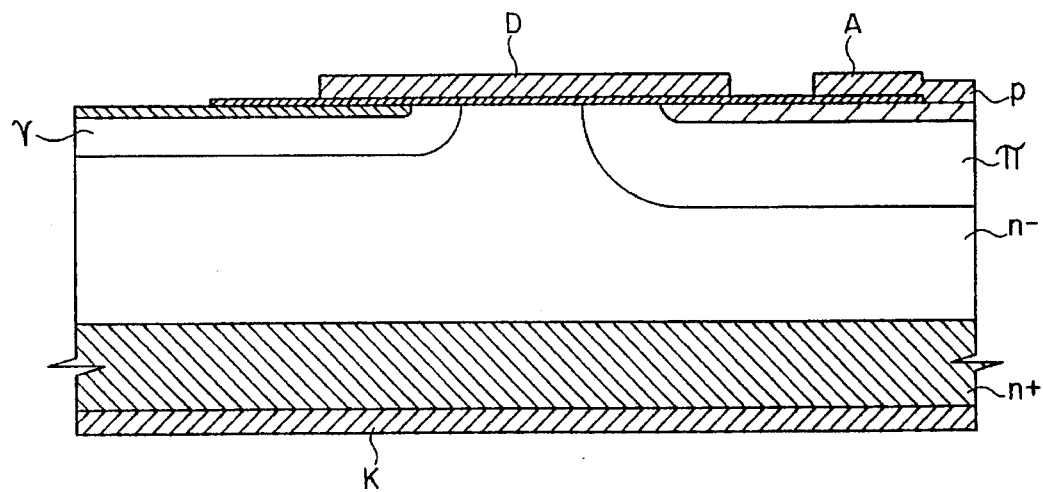

Both additional zones (zone ν and zone π) are present in FIG. 4.

Both additional zones ν and π are produced in a known manner by means of photo techniques, doping and diffusion.

Figure 5:
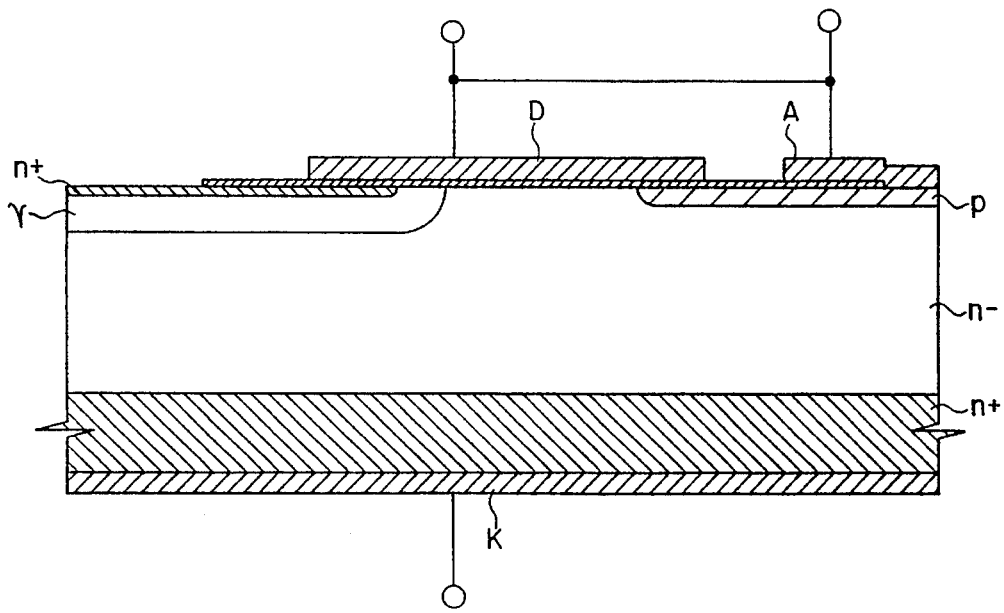

An arrangement corresponding to FIG. 2 with an additional zone ν is shown in FIG. 5, where the cover electrode D and the anode A are connected or where the cover electrode D is connected with the same potential as the first zone (p).

Figure 7:
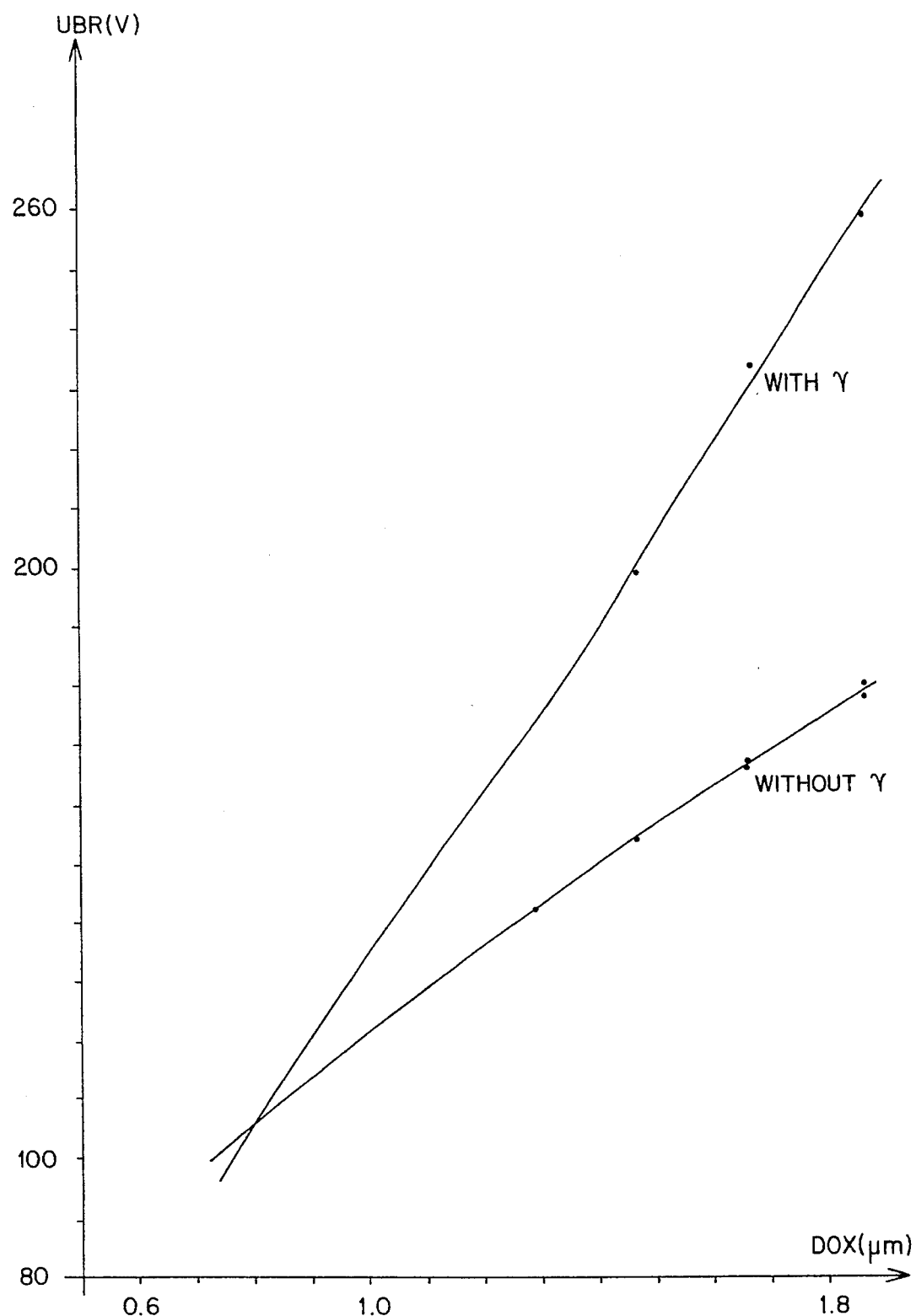

The value of the additional zone ν can be taken from the diagram in accordance with FIG. 7. There, the depletion breakthrough voltage between the anode A and the cathode K is drawn in for the case without the additional zone ν (lower branch of the curve) and with the additional zone ν (upper branch of the curve). The break-through voltage is shown on the vertical axis and the thickness of the oxide layer under the cover electrode is shown on the horizontal axis. It can be seen that, depending on the thickness of the oxide layer, in part clearly higher values can be obtained for the break-through voltage if an additional zone ν is used.

Figure 6:
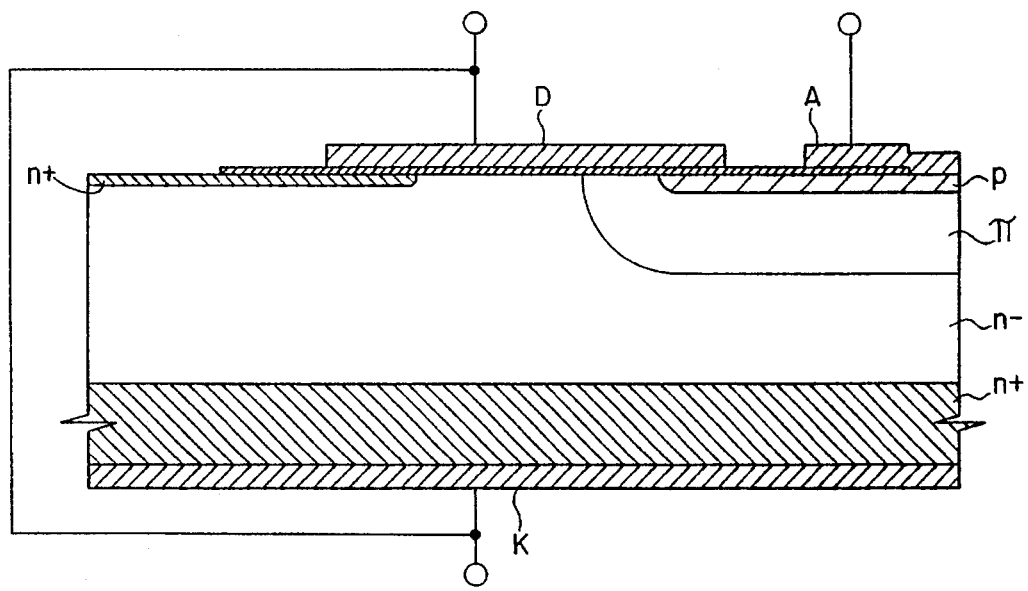

A semiconductor arrangement corresponding to FIG. 3 with an additional zone π is shown in FIG. 6, where the cover electrode D is connected with the cathode K or the cover electrode D and the cathode K are connected to the same potential, where a connection with the second zone ($n^+$) is also possible.

Figure 8:
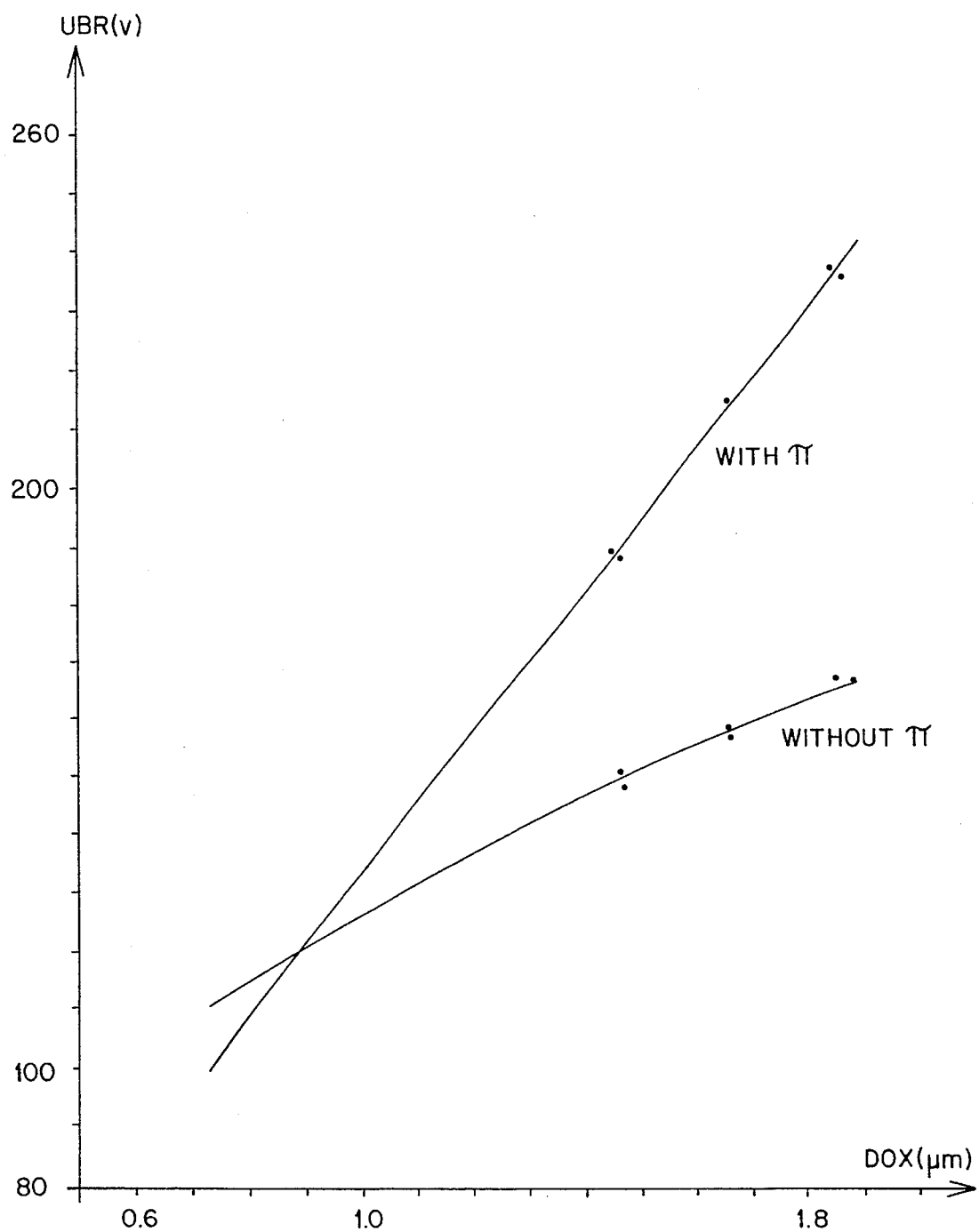
Figure 9:
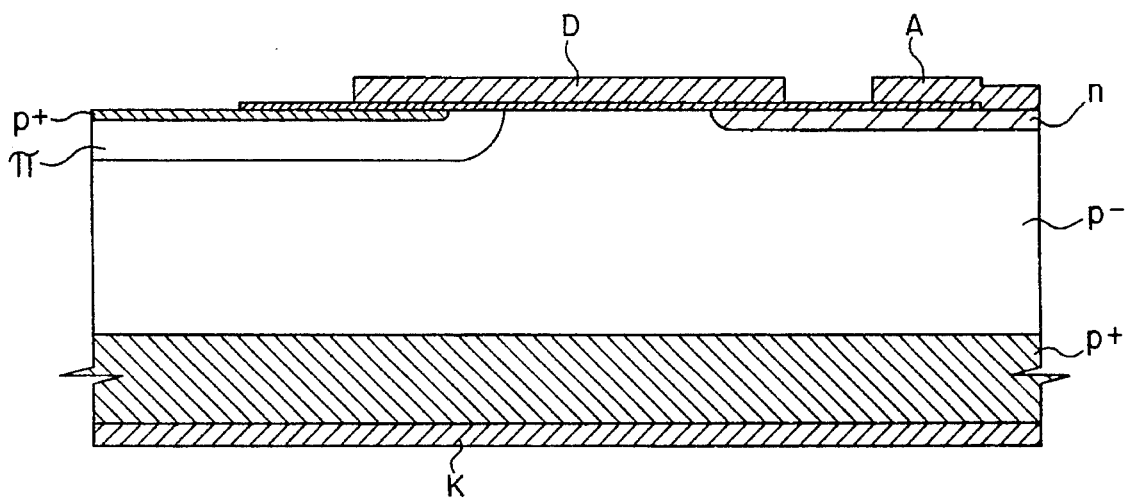

The enrichment break-through voltage with and without the additional zone π is shown analogously to FIG. 7 in FIG. 8. From this, too, it can be seen that, depending on the thickness of the oxide layer under the cover electrode D, clearly higher values for the break-through voltage are achieved if an additional zone π is added.

Thus, in certain cases arrangements corresponding to FIGS. 5 and 6 make it possible to obtain a desired blocking ability between the anode and cathode, even without the integration of a voltage divider which claims the silicon surface.

An arrangement corresponding to FIG. 4 is useful if an increased blocking ability is desired in connection with a voltage divider $R_1/R_2$.

We claim:

1. A monolithically integrated semiconductor device having a generally planar weakly-doped semiconductor substrate (2) with first and second main surfaces (3), (4);

a first zone of a conductivity type opposite to that of said substrate (2) and forming a pn junction with said substrate, said junction extending to said first main surface (3) at an edge portion of said first zone;

a second zone, whose conductivity type is the same as that of said substrate (2), formed along said first main surface (3) by strong diffusion doping of said substrate, but non-contiguous with said first zone;

a third zone, whose conductivity type is the same as that of said substrate (2), formed along said second main surface (4) by strong diffusion doping of said substrate, but non-contiguous with each of said first and second zones;

an insulating passivating layer (5) covering most of said first main surface (3) except for an uncovered area adjacent a surface of said first zone, thereby defining a contact window for said first zone; and a metallic cover electrode (D) applied to said passivating layer (5) on a side thereof remote from said substrate (2), extending over edge portions of said first and second zones and over that portion of said substrate (2) which is contiguous with said passivating layer (5) between said first and second zones;

further comprising, in order to increase breakdown voltage of said device between the first zone and the third zone, a fourth zone, whose conductivity type is the same as said second zone but less strongly doped, formed to be contiguous with said second zone and with said passivating layer (5) by diffusion doping of said substrate, extending between and separating said second zone from said substrate, with said fourth zone having a uniform surface concentration.

2. A semiconductor device according to claim 1, wherein the cover electrode and a second main surface (4) of the substrate (2) are electrically interconnected, bringing them to a common voltage or potential.

3. A semiconductor device according to claim 1, wherein the cover electrode and the first zone are electrically interconnected, bringing them to a common voltage or potential.

4. A semiconductor device according to claim 1, further comprising a voltage divider, and wherein the cover electrode (D) is connected via said voltage divider to a potential between that of the first zone and that of the second main surface (4) of the substrate (2).

5. A semiconductor device according to claim 1, wherein said substrate is an n-type conductivity semiconductor.

6. A semiconductor device according to claim 1, wherein said substrate is a p-type conductivity semiconductor.

7. A device according to claim 1, further comprising a fifth zone, of the same conductivity type as said first zone but less strongly doped, contiguous with said first zone and with said passivating layer (5), extending between and separating said first zone from said substrate.

* * * * *